(12) United States Patent
Kim

(10) Patent No.: US 7,839,658 B2
(45) Date of Patent: Nov. 23, 2010

(54) DISPLAY DEVICE AND BOARD SUPPORTING STRUCTURE

(75) Inventor: Dong Woo Kim, Daegu-si (KR)

(73) Assignee: LG Electronics Inc., Seoul (KR)

( * ) Notice: Subject to any disclaimer, the term of this patent is extended or adjusted under 35 U.S.C. 154(b) by 1141 days.

(21) Appl. No.: 11/483,551

(22) Filed: Jul. 11, 2006

(65) Prior Publication Data

US 2007/0097023 A1    May 3, 2007

(30) Foreign Application Priority Data

Nov. 2, 2005    (KR) .................... 10-2005-0104433

(51) Int. Cl.
*H05K 7/14* (2006.01)
(52) U.S. Cl. .................. 361/807; 361/809; 361/810
(58) Field of Classification Search ............... 361/807, 361/679.01, 679.02, 679.21, 808, 809, 810
See application file for complete search history.

(56) References Cited

U.S. PATENT DOCUMENTS

| | | | | |
|---|---|---|---|---|
| 5,786,989 | A  * |  7/1998 | Kawabe | 361/759 |
| 5,973,926 | A  * | 10/1999 | Sacherman et al. | 361/759 |
| 6,327,160 | B1 | 12/2001 | Liao | 361/809 |
| 6,744,186 | B2 |  6/2004 | Oishi et al. | 362/294 |
| 6,768,648 | B2 |  7/2004 | Kobayashi | 225/93 |
| 6,842,333 | B2 * |  1/2005 | Lee et al. | 361/679.55 |
| 6,955,554 | B2 * | 10/2005 | Korsunsky et al. | 439/328 |
| 7,102,895 | B1 * |  9/2006 | Copple | 361/802 |
| 7,114,974 | B2 * | 10/2006 | Korsunsky et al. | 439/325 |
| 7,357,645 | B2 * |  4/2008 | Jeong et al. | 439/66 |
| 7,378,794 | B2 |  5/2008 | Kim | 439/92 |
| 7,457,130 | B2 | 11/2008 | Kim | 361/638 |
| 7,492,578 | B2 * |  2/2009 | Kim | 313/49 |
| 7,505,270 | B2 * |  3/2009 | Kim | 361/704 |
| 2001/0048600 | A1 | 12/2001 | Oishi et al. | 362/294 |
| 2003/0230616 | A1 | 12/2003 | Kobayashi | 225/93 |
| 2005/0052827 | A1 |  3/2005 | Kim | 361/638 |
| 2005/0079748 | A1 |  4/2005 | Kim | 439/92 |
| 2005/0088092 | A1 |  4/2005 | Kim et al. | 313/582 |
| 2005/0164540 | A1 |  7/2005 | Korsunsky et al. | 439/328 |
| 2006/0114663 | A1 * |  6/2006 | Kim et al. | 361/807 |

FOREIGN PATENT DOCUMENTS

| | | | |
|---|---|---|---|
| CN | 1467543 A | 1/2004 | |
| CN | 1482796 A | 3/2004 | |

OTHER PUBLICATIONS

Chinese Office Action dated Feb. 20, 2009.
European Search Report dated Jul. 21, 2009.

* cited by examiner

*Primary Examiner*—Dameon E Levi
(74) *Attorney, Agent, or Firm*—KED & Associates, LLP

(57) ABSTRACT

Provided are a display device and a board supporting structure. The board supporting structure includes: a board; a main frame to which the board is fixed; a receiving portion formed at the main frame and on which the board is placed; and a connection member being a separate component fixing the board to the main frame and including a first portion coupled to the main frame and a second portion coupled to the board. Accordingly, an increase in thickness of the display device due to installation of the board is reduced, the performance reliability of the board is improved, the installation of the board is facilitated, and damage to the board is prevented.

10 Claims, 6 Drawing Sheets

DISPLAY DEVICE AND BOARD SUPPORTING STRUCTURE

BACKGROUND OF THE INVENTION

1. Field of the Invention

The present invention relates to a display device, and particularly, to a board supporting structure of a display device for fixing a board to a frame placed within a slim flat-display device. More particularly, the present invention relates to a board supporting structure capable of conveniently, simply and stably installing within a small area a board on which various circuits driving a display device are installed.

2. Description of the Related Art

In general, a display device displays an image upon receiving an electric signal. Examples of the display device include a cathode ray tube, a liquid crystal display device (LCD), a plasma display device (PDP), and the like.

Because the display device is an apparatus for displaying an image upon receiving an electric signal, it is essential to install a printed circuit board (hereinafter, referred to as a board) in order to display an image on a surface of a monitor by selectively transmitting an electric signal to an LCD panel placed at the surface of the monitor.

In general, the board is fixedly installed inside a display device, e.g., at one side of a main frame supporting an LCD module.

Usually, in order to fix the board onto the main frame, ']' a shaped protrusion is formed integrally with the main frame, and the board is directly placed and fixed onto the protrusion.

Specifically, a hole is formed on an upper horizontal surface of the protrusion, and a portion of the board is placed on the protrusion. Then, the board and the protrusion are fixed to each other using a screw, thereby fixing the board on the main frame.

The reason why the board is fixed to the main frame through the ']' shaped protrusion is that a predetermined interval needs to be formed between the board and the main frame in order to prevent the board from coming in contact with the main frame and thus to prevent short from occurring due to an electric signal flowing through the board.

However, the fixing of the board to the main frame through the ']' shaped protrusion is problematic in that the display device is thickened because a space as high as the vertical heights of various circuit components mounted on the board is needed.

Also, because the protrusion is coupled to the board in a state that a coupling member is in direct contact with the board, damage to the board may occur due to the engagement member.

SUMMARY OF THE INVENTION

Accordingly, the present invention is directed to a display device and a board supporting structure that substantially obviate one or more problems due to limitations and disadvantages of the related art.

An object of the present invention is to provide a display device and a board supporting structure capable of installing a board to a main frame so that a board fixedly installed to a main frame of a display device is insulated from the main frame to prevent electric short while the display device is not thickened.

Another object of the present invention is to provide a display device and a board supporting structure capable of preventing direct contact between an engagement member, such as a fixing screw, and a board in fixing the board to a main frame.

A further another object of the present invention is to provide a display device and a board supporting structure capable of facilitating the fixation of a board with respect to a main frame.

A still further another object of the present invention to provide a display device and a board supporting structure capable of improving the performance stability of a board by improving reliability of the electrical insulation between a main frame and a board.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a board supporting structure including: a board; a main frame to which the board is fixed; a receiving portion formed at the main frame and on which the board is placed; and a connection member being a separate component fixing the board to the main frame and including a first portion coupled to the main frame and a second portion coupled to the board.

In another aspect of the present invention, there is provided a display device including: a display module; a front cabinet formed at a front side of the display module; a back cover formed at a rear side of the display module; a main frame supporting the display module; a board to which the main frame is fixed; a receiving portion formed at a portion of the main frame to which the board is fixed and receiving the board; and a connection member connected to the main frame and the board and fixing the board to the receiving portion.

In a further another aspect of the present invention, there is provided a board supporting structure including: a board; a frame to which the board is fixed; a receiving portion on which the board is placed in the frame; and a connection member fixing the board to the receiving portion, in which the connection member further comprises a protrusion protruding toward the board, the board further comprises a slot in which the protrusion is inserted, and the protrusion is bent after inserted into the slot and thus supports the board.

In a still further another aspect of the present invention, there is provided a board supporting structure including: a board; a main frame to which the board is fixed; a receiving portion formed at a portion of the main frame to which the board is fixed; and a connection member having at least one portion bent vertically to fix the board at a height equal to or lower than the main frame.

In a still further another aspect of the present invention, there is provided a board supporting structure including: a board; a main frame to which the board is fixed; a receiving portion formed at a portion of the main frame to which the board is fixed; a connection member fixing the board to the receiving portion; and a frame-side connection-member fixing portion protruding upward of the main frame from a portion where the connection member and the main frame meet each other.

Accordingly, an increase in thickness of the display device due to installation of the board is reduced, the performance reliability of the board is improved, the installation of the board is facilitated, and damage to the board is prevented.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1:
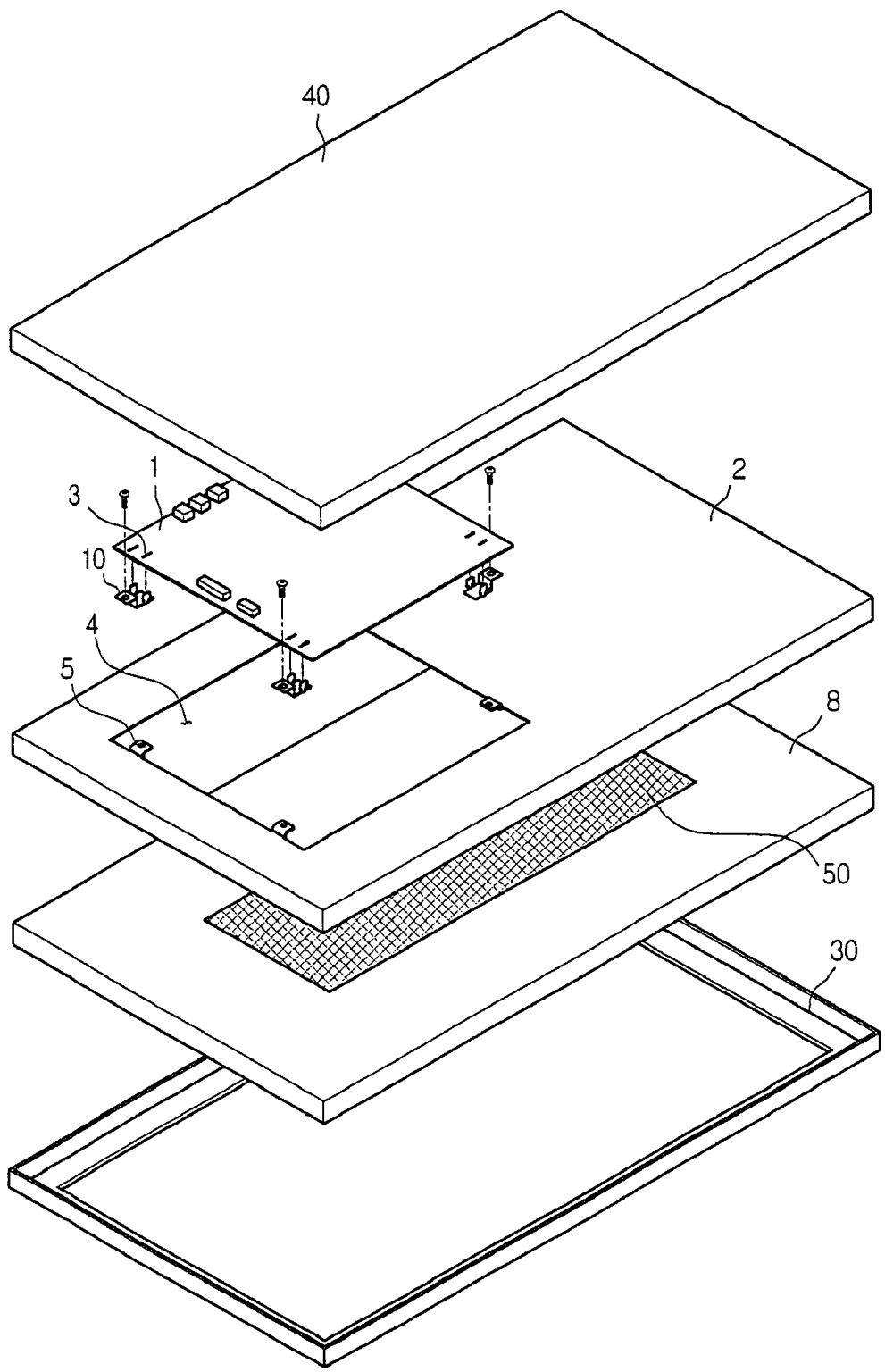
FIG. 1 is an exploded perspective view of a display device according to a first embodiment of the present invention.

FIG. 1 is an exploded perspective view of a display device according to the present invention.

Referring to FIG. 1, the display device according to the present invention includes a front cabinet 30 and a back cover 40 respectively protecting front and rear sides of the display device, a display module 8 providing an image actually, a main frame 2 fixed to a rear side of the display module 8, supporting a display module 8 and reinforcing the strength, and a board 1 installed at the main frame 2.

Also, the board 1 is fixed to the main frame 2 by a connection member 10, and a place where the board 1 is placed is aligned with a receiving portion 4.

Also, in order to provide a portion receiving the board 1, a receiving portion 4 is formed in the main frame 2. The receiving portion 4 may be formed in a shape having a height equal to the entire height of the main frame 2 and a predetermined area corresponding to an area of the board 1, or the receiving portion 4 may be recessed at a certain height in the main frame 2. Also, the receiving portion 4 may be a predetermined hollow portion formed by cutting off a certain portion of the main frame 2 and thus allowing direct observation of the inside. The forming of the receiving portion 4 as the recessed portion or the hollow portion may advantageously prevent an increase in thickness of a display device occurring due to the installation of a board. More advantageously, the hollow receiving portion allows installation of a frame-side connection-member fixing portion 5 without an increase in thickness due to the thickness of the main frame 2 itself. Hereinafter, the receiving portion will be illustrated as a hollow one.

Also, two portions of the connection member 10 are connected to the frame-side connection-member fixing portion 5 formed at the main frame 2 and a board-side connection-member fixing portion 3, respectively. Here, various methods such as screw or catching may be used for the connection.

Also, an insulation material 50 is further formed on a rear surface of the display module 8 that is aligned with the receiving portion 4. The insulation material 50 prevents electrical discharge between the board 1 and the display module 8 and thus allows stable operation of the board 1. When a distance between the board 1 and the display module 8 is long, the insulation material 50 may not be needed. However, mounting the insulation material 50 is more desirable in order to reduce the thickness of the display device.

Referring to the aforementioned structure of the display device, the operation and effect of the board supporting structure according to the present invention will now be described.

First, a connection member 10 is coupled to the board 1. The connection member 10 coupled to the board 1 is aligned with the frame-side connection-member fixing portion 5. Then, a coupling member 20 such as a screw is inserted into the connection member 10 and the frame-side connection-member fixing portion 5, thereby entirely fixing the board 1 to the main frame 2.

Here, the main frame 2 may be a separate component that is fixed to the display module 8 in manufacturing the display device, or may be any component that is manufactured together with the display module 8 and reinforces the strength of the display module 8.

After the main frame 2 is coupled with the board 1 as an assembly, the assembly is installed at a space between the front cabinet 30 and the back cover 40, thereby completing the manufacturing of the display device.

A coupling method between the main frame and the board will now be described in more detail.

Figure 2:
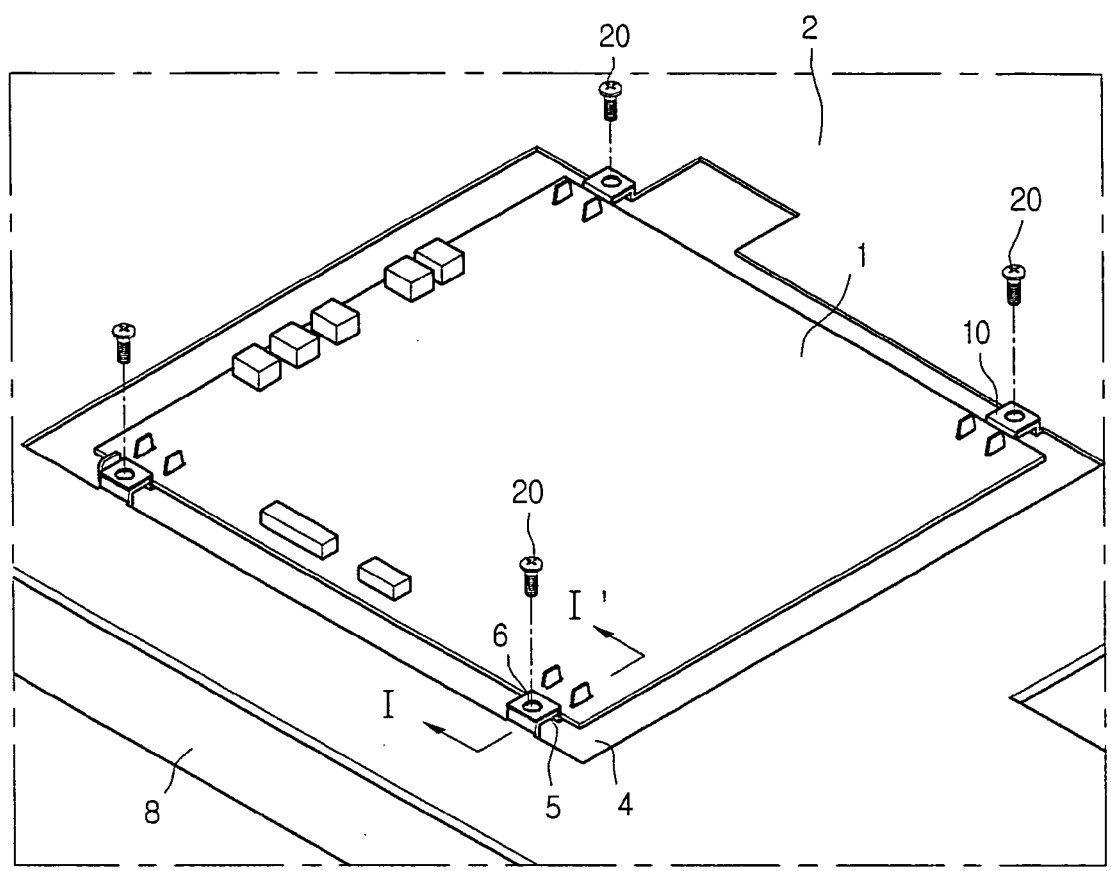
FIG. 2 is a perspective view of a board supporting structure according to the first embodiment of the present invention.
Figure 3:
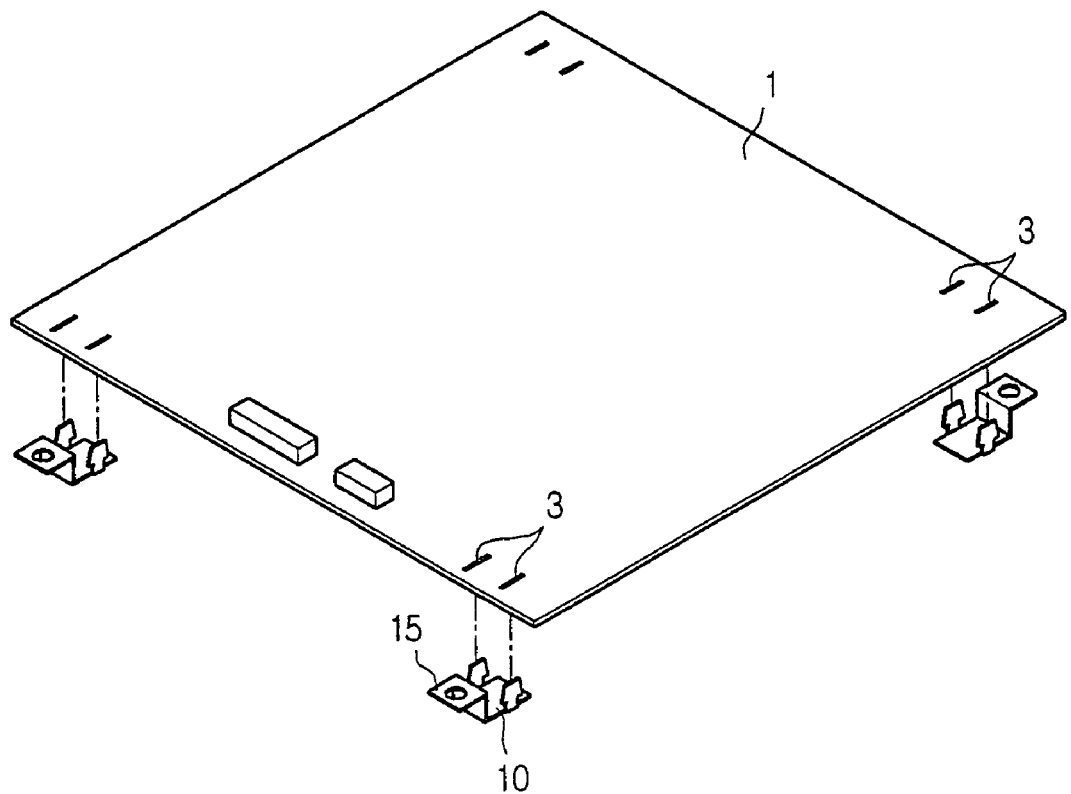
FIG. 3 is an exploded perspective view of the board supporting structure according to the first embodiment of the present invention.

FIG. 2 is a perspective view of a board supporting structure according to a preferred embodiment of the present invention, and FIG. 3 is a perspective view illustrating that a board is coupled to a connection member in the board supporting structure according to the present invention.

Referring to FIGS. 2 and 3, the board supporting structure according to the present invention includes a board 1, a main frame 2 to which the board is fixed, and a connection member 10 fixing the board 1 to the main frame 2.

In more detail, a receiving portion 4 slightly wider than the main frame 2 is provided at one side of the main frame 2, and the board 1 is placed on and fixed to the receiving portion 4. At least one connection member 10 for fixing the board to the main frame 2 is coupled to an outer circumferential portion of the board 1.

The connection member 10 is coupled to the frame-side connection-member fixing portion 5 provided at the receiving portion 4 of the main frame 2 by a coupling member 20 such as a screw. In such a manner, the board 1 is fixed to the main frame 2.

In the board supporting structure according to the embodiment of the present invention, the main frame 2 is cut out to provide a receiving portion 4 on which the board 1 can be placed. After placing on the receiving portion 4, the board 1 is fixed to the main frame 2 at a height equal to the main frame 2. Accordingly, an interval between the board and the main frame, which necessarily occurred when a board was installed at a main frame in the conventional art, is no longer generated.

Figure 4:
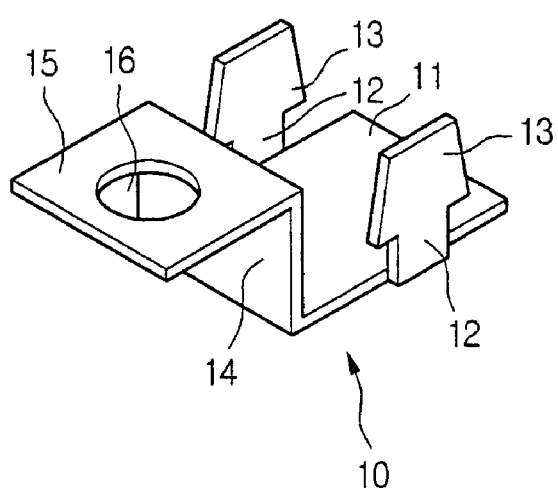
FIG. 4 is a perspective view of a connection member used to fix a board to a main frame according to the first embodiment the present invention.

FIG. 4 is a perspective view of the connection member.

Referring to FIGS. 3 and 4, fixing the board 1 to the main frame 2 according to the present invention is achieved by coupling at least one connection member 10 to an outer circumferential portion of the board 1 and by fixing the connection member 10 to the main frame 2 with a connection member 20.

In more detail, board-side connection-member fixing portions 3, each having a pair of parallel slots, are formed at four corners of the board 1. A portion of the connection member 10 is penetratingly coupled to the board-side connection member fixing portion 3.

Here, in the board fixing board according to the preferred embodiment of the present invention, the connection members are coupled to the board at four corners of the board to face one another. However, positions of the connection-member fixing portions to which the connection members are coupled, and the number of connection members for fixing the board to the main frame may be modified in various manners.

The connection member 10 coupled to the board-side connection-member fixing part 3, includes a board support surface 11 placed to come in contact with a lower surface of the board 1 and supporting the board 1, a board coupling portion 12 protruding upward from one side of the support surface 11 and inserted to the board-side connection-member fixing portion 3, a vertical portion 14 extendingly upwardly from an outer corner of the support surface 11, and a frame coupling portion 15 extending from the vertical portion 14 outwardly of the support surface 11 and fixed to one side of the main frame 2.

The board support surface 11 is formed to come in contact with a lower surface of the board 1 when the connection member 10 is coupled to the board 1. The board support surface 11 supports the board 1 when the board 1 is fixed to the main frame 2.

The board coupling portion 12 protrudes upward from a corner of the support surface 11. A pair of board coupling portions 12 are formed side by side on the board support surface 11, corresponding to the slots of the board-side connection-member fixing portion 3 formed in the board 1. To this end, the board coupling portion 12 is formed as a protrusion having a sectional surface corresponding to the slot of the board-side connection-member fixing portion 3 and thusly can be inserted in the board-side connection-member fixing portion 3 of the board 1.

The protrusion is formed at a height greater than a thickness of the board 1. A projection 13 having a wider width than that of the protrusion 12 is formed at an end portion of the board coupling portion 12. Accordingly, the entire board coupling portion 12 is formed as an arrow (↑) shape facing upward.

Here, the board coupling portion 12 has a very thin section and thus can be moved when receiving an external force or twisted by hands. A coupling process between the board coupling portion 12 and the board-side connection-member fixing portion 3, performed by such a shape of the board coupling portion 12, will now be described.

First, the board coupling portion 12 is penetratingly inserted in the board-side connection-member fixing portion 3. Then, the projection 13 placed at an upper side of the board coupling portion 12 protrudes to an upper surface of the board. Thereafter, the projection 13 is bended in a direction perpendicular to a slot direction of the board-side connection-member fixing portion 3. In such a state, the projection 13 may be fixed to the board 1 by using a certain method, e.g., welding or bonding.

Also, the vertical portion 14 extends upward from an outer corner of the connection member 10. Here, the place where the vertical portion 14 is formed may come in contact with or be adjacent to a side surface of the board 1 when the board support surface 11 comes in contact with a lower side of the board 1. The length of the vertical portion 14 extending upward is greater than the thickness of the board, so that the board may be placed at a sufficiently low place, thereby preventing the thickness of the board 1 from affecting the thickness of the display device.

Also, the frame coupling portion 15 is formed at an end of the vertical portion outwardly of the board 1. A screw hole 16 is formed at the center of the frame coupling portion 15. The coupling member 20 such as a screw penetrates the screw hole 16 and is coupled to the frame-side connection-member fixing portion 5 formed at the main frame 2, thereby connecting the connection member 10 to the main frame 2.

The frame-side connection-member fixing portion 5 protrudes inwardly of the receiving portion 4 from an edge of the receiving portion 4. In detail, the frame-side connection-member fixing portion 5 is formed as a protrusion protruding upward from a plane where the receiving portion of the main frame 2 is formed, and works as a plane on which a lower side of the frame coupling portion 15 of the connection member 10 may be placed. The frame-side connection-member fixing portion 5 has at its upper surface, a screw receiving groove 6 through which the coupling member 20, such as a screw, having penetrated the frame coupling portion 15 of the connection member 10, can be coupled thereto.

Figure 5:
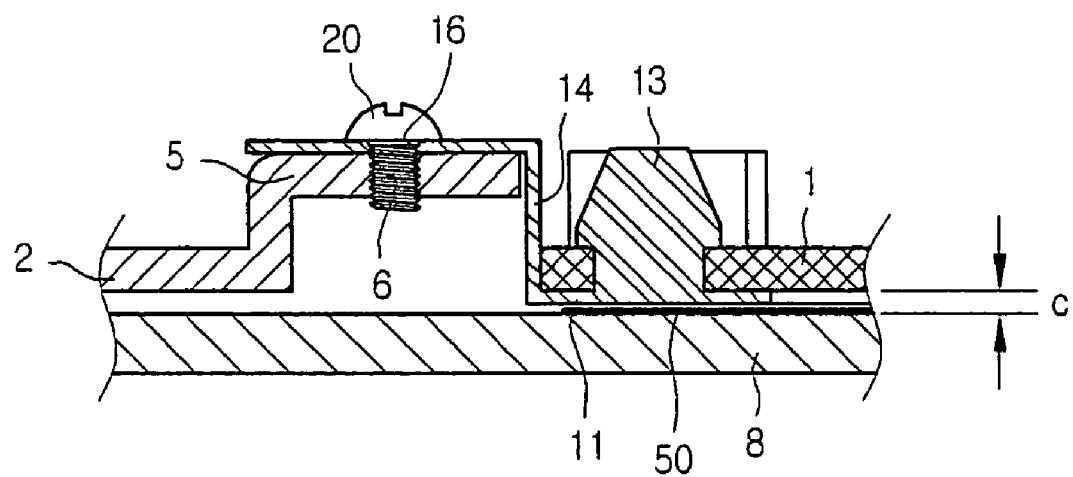
FIG. 5 is a cross-sectional view taken along line I-I' of FIG. 1.

The form that the board 1 is coupled to the main frame 2 by the aforementioned connection member 10 is illustrated in FIG. 5, the cross-sectional view taken along line I-I' of FIG. 2 in detail.

As illustrated in FIG. 5, the board that is coupled to the main frame 2 by the board supporting structure according to the present invention is placed at a height equal to the main frame 2. It can be easily predicted that the board can be placed at a place lower than the main frame 2 when an interval between the main frame 2 and a display module 8 is sufficiently long.

Here, as illustrated in FIG. 5, a predetermined interval (C) may be formed between the board 1 and the module 8 placed under the main frame 2. The interval is the minimum distance to prevent electric discharge occurring between the board 1 and the display module 8 due to the approach of an end of an electric discharged portion protruding downward from the board 1 to the module 8, and the sufficient interval therebetween is approximately 5~6 mm. Also, for the purpose of achieving more reliable electrical insulation between the board 1 and the display module 8, an insulation material 50 may be additionally provided on a surface of the display module 8 facing the board 1. When the insulation material 50 is further formed, the reliability of the electric insulation is improved and the possibility of the electric discharge is reduced. For this reason, the interval between the board 1 and the display module 8 can be even more reduced advantageously.

The vertical portion 14 of the connection member is formed at a height equal to a height from a lower surface of the board 1 up to an upper surface of the substantial board thickness including electric parts mounted on the board. Accordingly, one side of the vertical portion 14 is fixed to the main frame 2, and the other side thereof is coupled to a lower side of the board 1, thereby supporting the board 1 with respect to the main frame 2.

As compared to the case where a board is placed directly on a main frame according to the conventional art, the using of the board supporting structure according to the present invention may allow a space economy to an extent greater than a thickness of the main frame itself and thus makes the display device thinner totally as much.

Also, because the connection member is formed in a shape bent at least one portion in a vertical direction, the connection member can elastically move vertically even during or after the coupling of the connection member. Therefore, the fixation of the board can be facilitated, and the fixation position of the board can be maintained against an external impact even after the board is fixed to the main frame. Also, the reliability of the performance of the board can be improved.

Also, in the present invention, because a fixation screw is not directly fixed to the board due to the use of a separate board connection member, damage to the board directly by a screw does not occur.

Also, ultimately, a thin display device may be constructed.

Also, because the board is fixed to the main frame using a special connection member, direct damage or scratch to the board which may occur during fixation of the board with a screw can be prevented.

Second Embodiment

The second embodiment of the present invention is identical to the first embodiment, except for a connection member and structures of a board and a main frame at their portions where the connection member is coupled. Therefore, the connection member and the portions related thereto are described in detail, portions without specific description will cite the description of the first embodiment, and detailed description thereof will be omitted.

Figure 6:
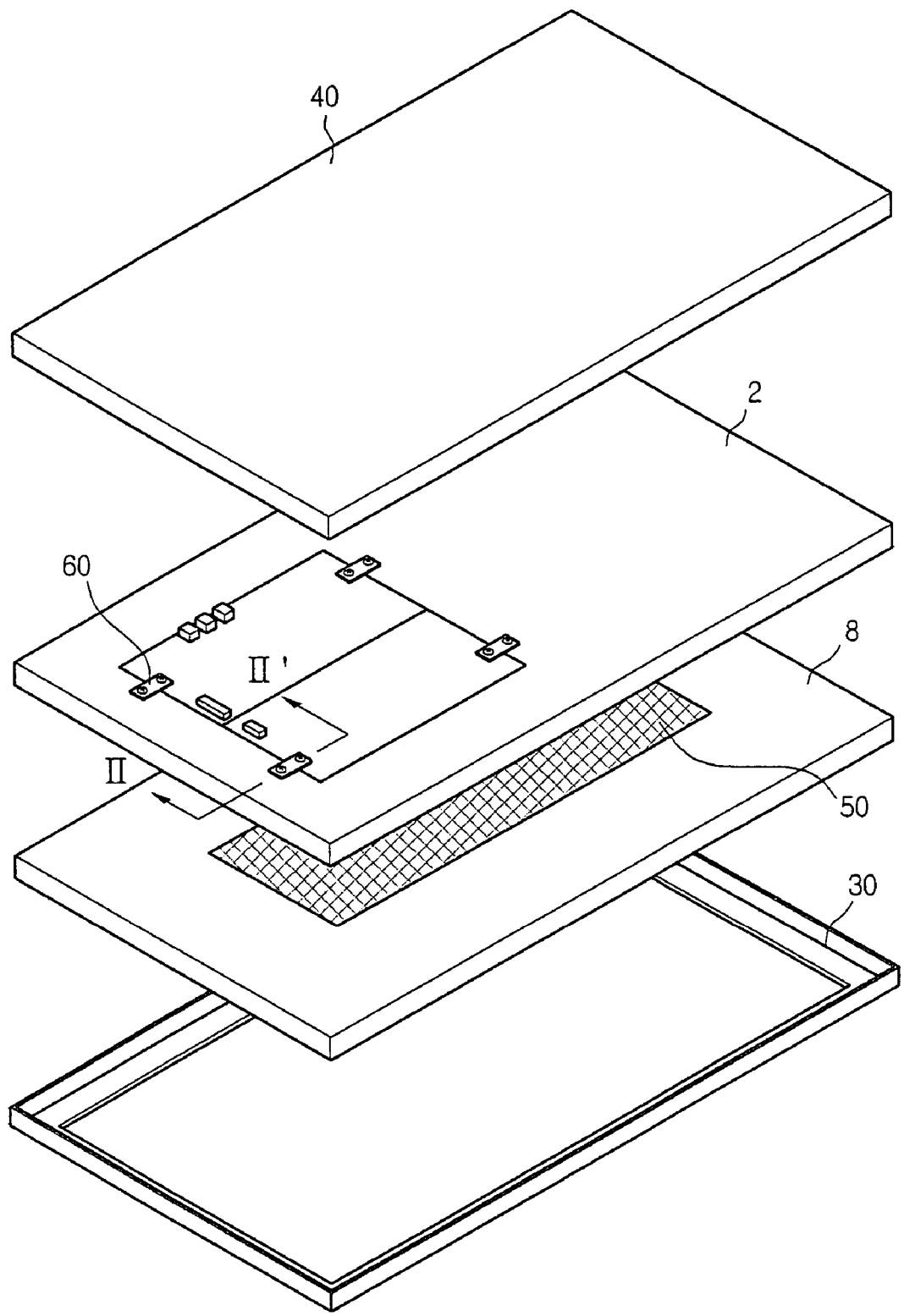
FIG. 6 is an exploded perspective view of a display device according to a second embodiment of the present invention.
Figure 7:
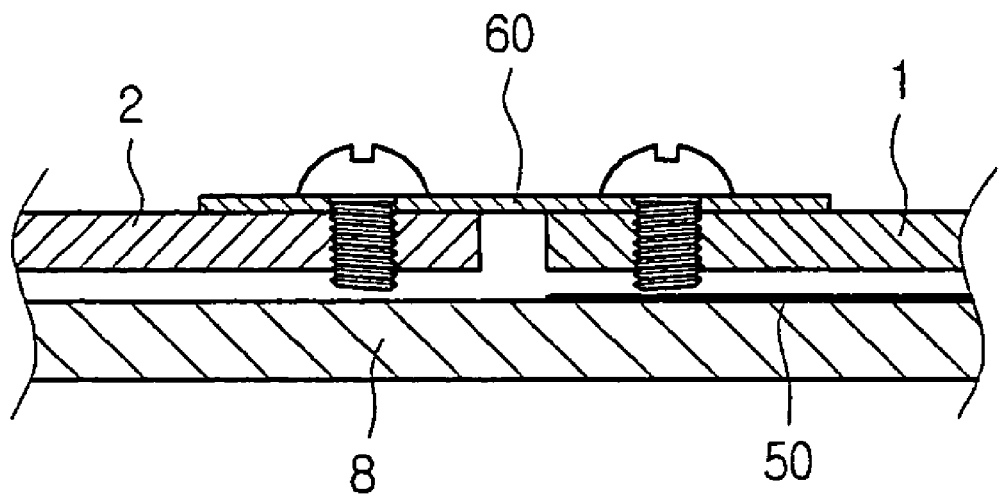
FIG. 7 is a cross-sectional view taken along line II-II' of FIG. 6.

FIG. 6 is an exploded perspective view of a display device according to a second embodiment of the present invention, and FIG. 7 is a cross-sectional view taken along line II-II' of FIG. 6.

Referring to FIGS. 6 and 7, the connection member 60 according to the present embodiment is formed in a single plane shape, and both ends of the connection member 60 are connected to a board 1 and a main frame 2 by a connection screw, respectively.

The connection member 60 is formed straight to connect the main frame 2 with the board 1, and the board 1 and the main frame 2 are placed at the same actual height. Accordingly, the entire thickness of the display device can be reduced.

Also, no protruding portion is provided at a portion of the main frame 8 where the connection member 60 is connected. Accordingly, an installation height of the connection member 60 is not increased so that the entire thickness of the display device can be reduced. Of course, the possibility of electric discharge due to the small interval between the board 1 and the display module 8 may exist, but such electric discharge can be prevented by an insulation material 50.

In another embodiment within the scope of the present invention, the board 1 and/or the main frame 8 coupled to the connection member 60 may be provided with a certain structure. The certain structure may have a similar shape to the board coupling portion 12 provided to the connection member to be caught and stopped and fixed thereby.

Also, even though the connection member 60 comes in contact with upper surfaces of the board 1 and the main frame 8 in the drawing, it can be easily predicted that the connection member 60 is not limited thereto but comes in contact with lower surfaces of the board 1 and the main frame 8 at a certain position.

Also, even though the connection member 60 is formed straight in the drawing, it can be easily predicted that the connection member 60 may include a predetermined elastically-deformed portion to support the board 1 with a certain level of elastic force.

Third Embodiment

The third embodiment of the present invention is identical to the second embodiment, except for a structure of a main frame at its portion to which a connection member is coupled. Therefore, only the portion related to the main frame to which the connection member is mounted will be described in detail, portions without specific description will cite the description of the aforementioned embodiment, and detailed description thereof will be omitted.

Figure 8:
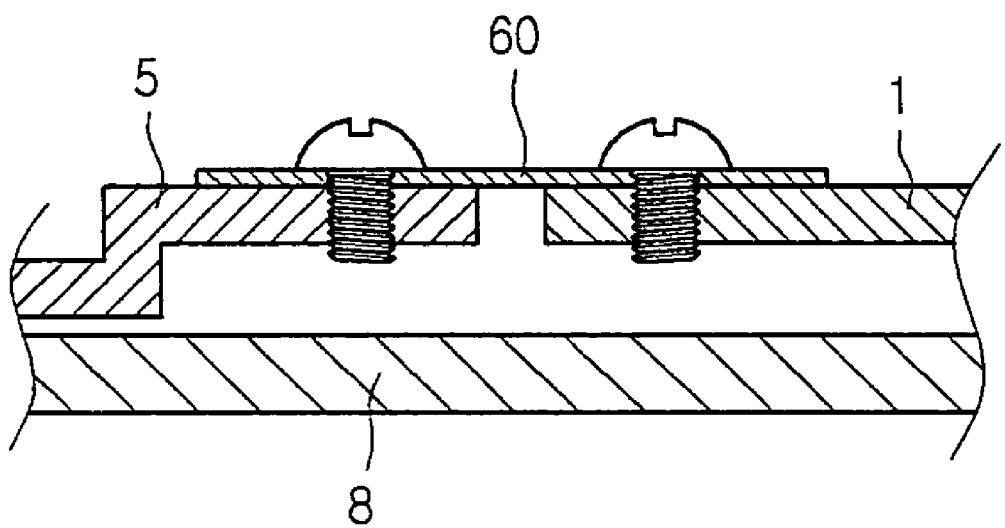
FIG. 8 is a cross-sectional view illustrating a board supporting structure of a display device according to a third embodiment of the present invention.

FIG. 8 is a cross-sectional view of a board supporting structure of a display device according to the present embodiment.

Referring to FIG. 8, in the present embodiment, a frame-side connection-member fixing portion 5 is provided to the main frame 2 like the first embodiment. For this reason, an interval between the board 1 and the display module 8 becomes long, and therefore, an insulation material 50 may not be needed.

However, even in this case, forming the insulation material 50 as in other embodiments may more efficiently prevent electric discharge between the board 1 and the display module 8.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A board supporting structure comprising:
   a board;
   a main frame to which the board is supported;
   a receiving portion formed at the main frame and in which the board is placed; and
   a connection member being a separate component to support the board to the main frame and including a first portion coupled to the main frame and a second portion coupled to the board,
   wherein the receiving portion is formed in a cut-out region of the main frame or a recessed region of the main frame such that the board is received in the receiving portion,
   and wherein the second portion includes a protrusion protruding toward the board, and the board includes a board-side connection-member fixing portion placed at a position aligned with the protrusion and having an opening.

2. The board supporting structure according to claim 1, wherein the main frame is coupled to a display module.

3. The board supporting structure according to claim 1, wherein the connection member is formed in plurality and coupled to the main frame.

4. The board supporting structure according to claim 1, wherein the board is placed at the same height as the main frame.

5. The board supporting structure according to claim 1, wherein the connection member is coupled to an edge of the board.

6. The board supporting structure according to claim 1, wherein the connection member is aligned with a lower surface of the board.

7. The board supporting structure according to claim 1, wherein the main frame includes a protruded portion at a position that contacts the connection member.

8. The board supporting structure according to claim 1, wherein the protrusion is inserted in the board-side connection-member fixing portion and then is bent to prevent separation.

9. The board supporting structure according to claim 1, wherein the second portion includes two or more of the protrusions at one connection member.

10. The board supporting structure according to claim 1, wherein the first portion of the connection member is placed higher than the second portion thereof.

* * * * *